United States Patent [19]

Takekoshi et al.

[11] Patent Number: 5,210,005
[45] Date of Patent: May 11, 1993

[54] METHOD AND APPARATUS FOR DEVELOPING PHOTOSENSITIVE LITHOGRAPHIC PLATE

[75] Inventors: Tomoaki Takekoshi; Sho Nakao; Hisao Ohba; Seiji Shigetaka, all of Shizuoka, Japan

[73] Assignee: Fuji Photo Film Co., Ltd., Kanagawa, Japan

[21] Appl. No.: 393,190

[22] Filed: Aug. 14, 1989

[30] Foreign Application Priority Data

Aug. 16, 1988 [JP] Japan .................................. 63-203398
Aug. 16, 1988 [JP] Japan .................................. 63-203399
Aug. 16, 1988 [JP] Japan .................................. 63-203402

[51] Int. Cl.⁵ .......................... G03F 7/26; G03D 3/08
[52] U.S. Cl. ................................... 430/302; 430/320; 430/434; 354/317; 354/319; 354/325
[58] Field of Search .................. 354/317, 325, 319; 430/320, 302, 434

[56] References Cited

U.S. PATENT DOCUMENTS 3,282,695 1/1964 Narodny ........................... 354/317
3,330,197 1/1965 Böeger ............................. 354/317
4,001,854 1/1977 Formoy ............................ 354/318
4,737,810 4/1988 Kobayashi et al. ................ 354/325

FOREIGN PATENT DOCUMENTS 55-115039 9/1980 Japan .
56-12645 2/1981 Japan .

Primary Examiner—Charles L. Bowers, Jr.
Assistant Examiner—John S. Chu
Attorney, Agent, or Firm—Sughrue, Mion, Zinn Macpeak & Seas

[57] ABSTRACT

A method and an apparatus for developing a photosensitive lithographic plate at least one layer of which has been exposed with an image by a developer with conveying the same with the one layer facing substantially downwards, the method and apparatus being arranged in such a manner that the developer is supplied to the one layer and the thus-supplied developer is retained on the same layer.

Therefore, the photosensitive lithographic plate can be developed without any necessity of being dipped in the developer.

17 Claims, 15 Drawing Sheets

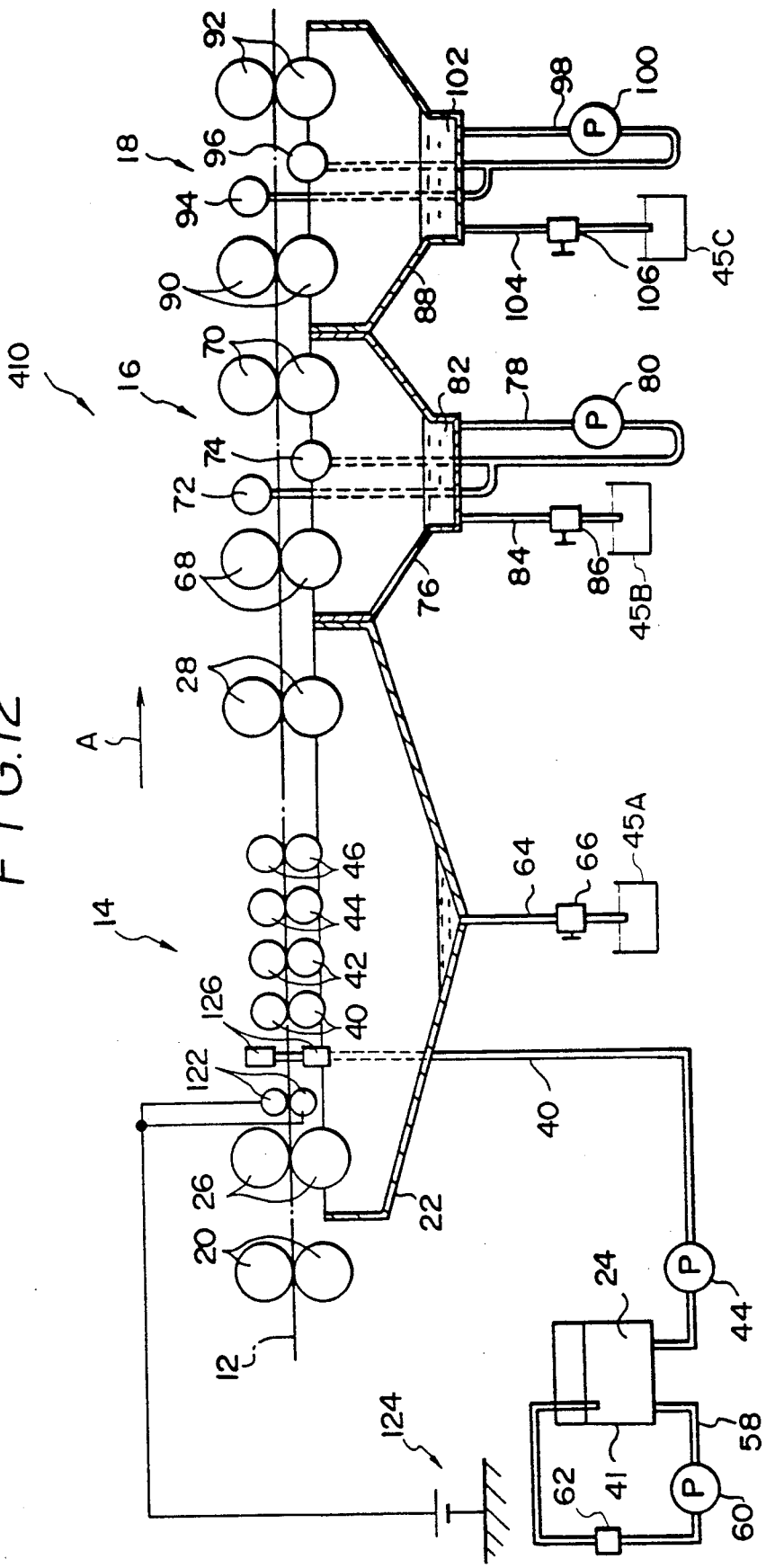

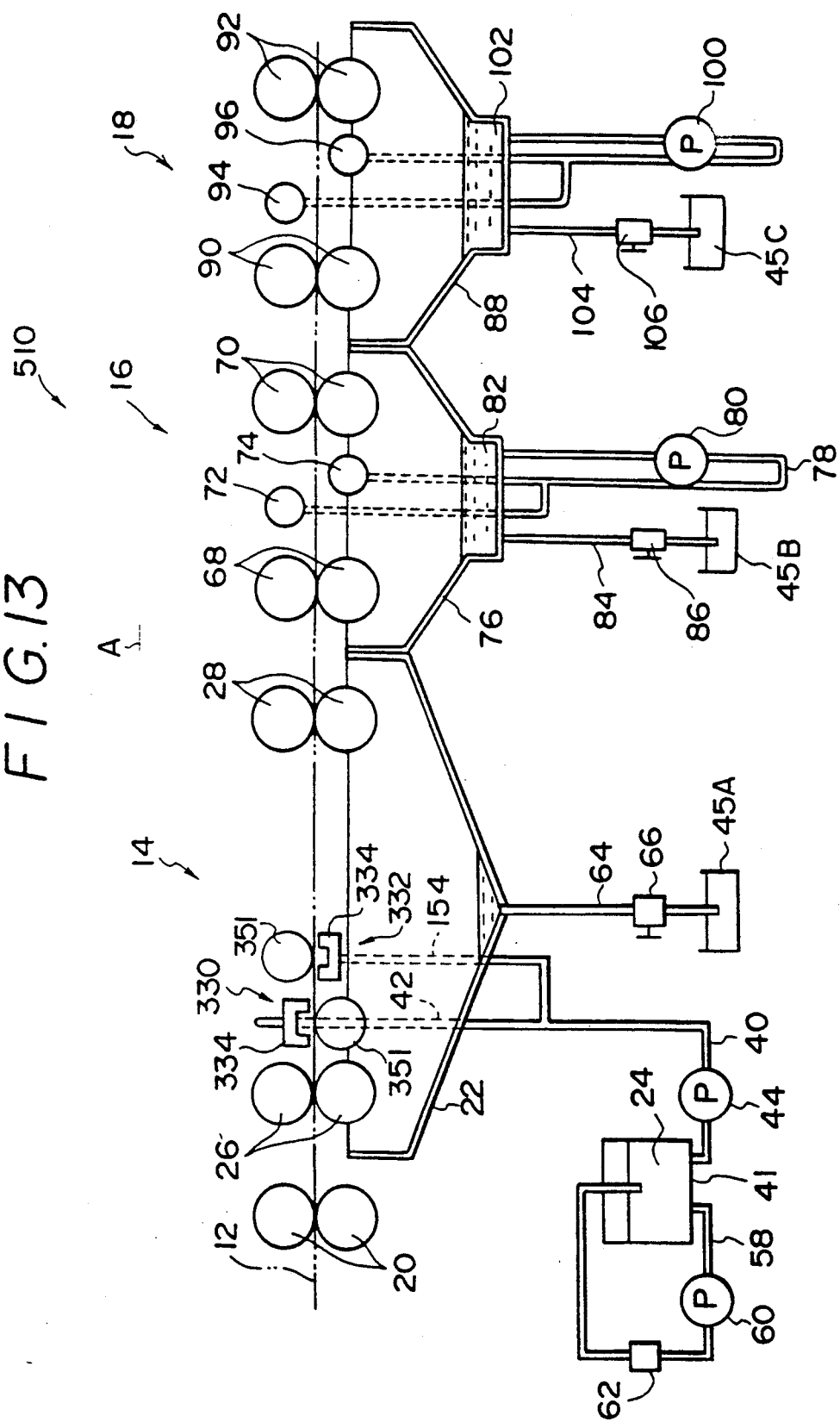

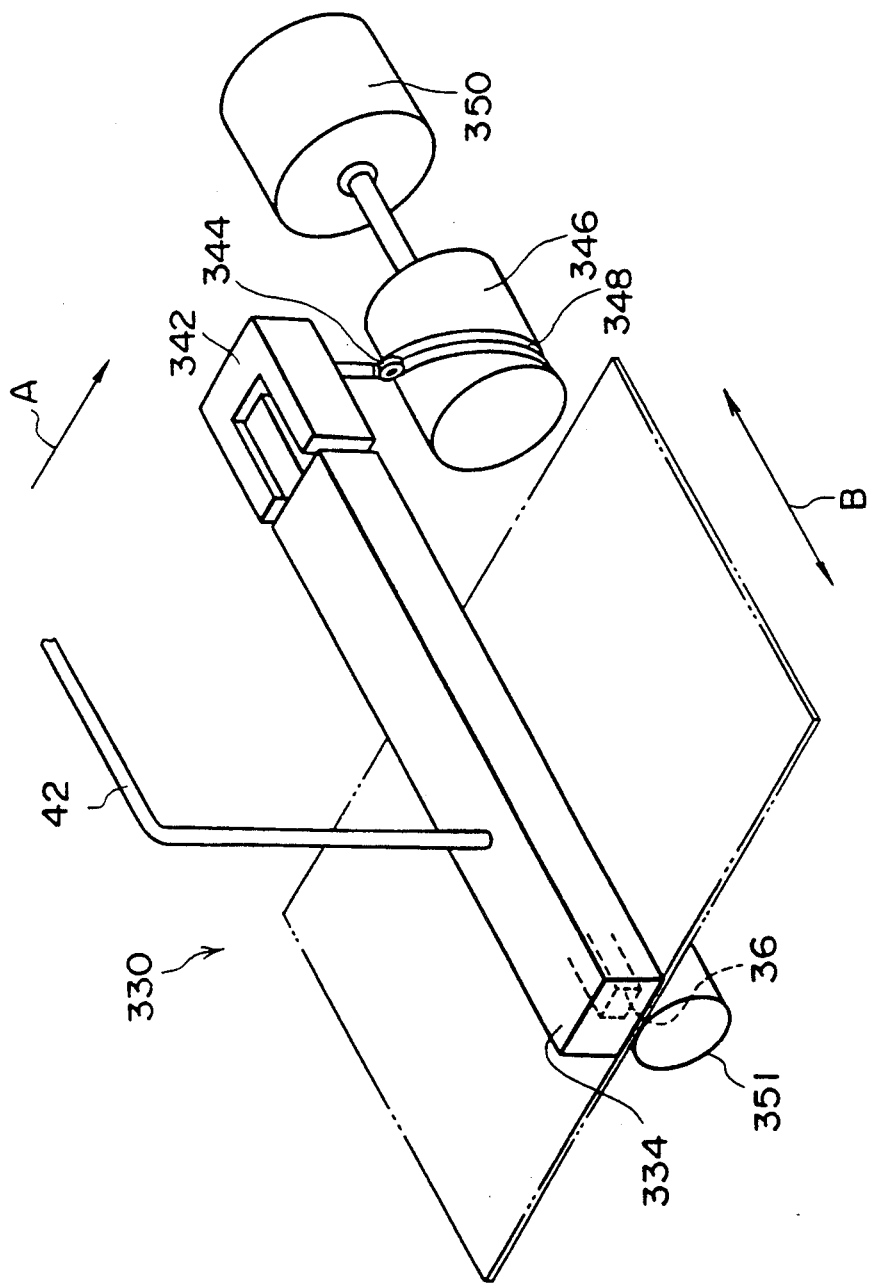

METHOD AND APPARATUS FOR DEVELOPING PHOTOSENSITIVE LITHOGRAPHIC PLATE

BACKGROUND OF THE INVENTION

Field of the Invention

The present invention relates to a method and an apparatus for developing photosensitive lithographic plate on which an image has been exposed.

A photosensitive lithographic plate on which an image has been exposed is transported to an apparatus for developing the photosensitive lithographic plate in which it is subjected to development.

The development can be realized by a spraying method arranged such that the developer is supplied through a spray to the surface of the photosensitive material, a dipping method arranged such that the photosensitive lithographic plate is introduced into a developing tank in which the developer is contained, and a metering method arranged such that a developer necessary to complete the development is applied to the surface of the photosensitive lithographic plate. However, since the above-described spraying method uses the developer in a recirculated manner, it can gradually deteriorate due to eluted components from the photosensitive layer of the photosensitive material. Furthermore, in a case where an alkaline developer is employed in this spraying method, the developer also deteriorates due to carbon dioxide in air.

The dipping method needs a large quantity of developer to be used since the photosensitive lithographic plate has to be dipped into the developer. Furthermore, as a considerably large number of plates is developed, the developer deteriorates. In order to prevent the above-described deterioration of the developer, various methods of replenishing the developer have been disclosed in Japanese Patent Laid-Open No. 50-144502, Japanese Patent Laid-Open No. 54-62004, Japanese Patent Laid-Open No. 55-115039, and Japanese Patent Laid-Open No. 56-12645. However, these methods need a complicated and expensive apparatus. Furthermore, when used developer is replaced by unused one, developer which can be used may be discarded. Therefore, efficient use of the developer without waste can not be achieved by the dipping method.

On the other hand, quantity of the developer of the metering method can be reduced as compared with that of the above-described spraying method or the dipping method and replenishing device or the circulating device is not necessary, and thus the structure of the apparatus is simplified.

A metering method has been proposed in Japanese Patent Patent Application No. 62-87964. According to this method, a photosensitive lithographic plate is transported substantially vertically while the developer is applied onto the plate.

However, according to this method, the developer applied as described in the above naturally drops, and spoils the photosensitive lithographic plate, the inside of the apparatus or the outside of the apparatus.

Furthermore, the above-described vertical transportation of the photosensitive lithographic plate needs to be provided with guides and conveying rollers for the purpose of turning the direction of the conveyance of the photosensitive lithographic plate from the substantially horizontal direction to the substantially vertical direction. To this end, a method has been disclosed that is arranged such that the photosensitive lithographic plate is conveyed in the horizontal direction with the photosensitive layer thereof faced upward and developer is applied to the layer.

However, when the developer is applied to the photosensitive lithographic plate conveyed in substantially the horizontal direction according to the above-described metering method, the developer can be retained on the surface of the plate without any drops where layer of the plate on which an image is recorded is faced upward. However, the developer naturally drops where the layer faces downward. Accordingly, the layer which faces downward cannot be subjected to the development. That is, the both layers of the photosensitive lithographic plate or the layer facing downward of the same are not always developed.

SUMMARY OF THE INVENTION

To this end, an object of the present invention is to provide a method and an apparatus for developing a photosensitive lithographic plate capable of assuredly developing either of the layers of this plate with the minimum quantity of the developer.

A method and an apparatus for developing a photosensitive lithographic plate are arranged such that the photosensitive lithographic plate on which an image has been exposed is automatically conveyed and developed, the method and apparatus being characterized in that substantially unused developer is supplied to and retained on at least the lower side layer of this photosensitive lithographic plate for every development treatment before removal of this developer with a predetermined amount of it retained on lower side layer of the plate so that the development treatment is conducted.

According to the present invention described above, the photosensitive lithographic plate on which an image has been exposed is subjected to the application of the developer with the two sides layers thereof with being conveyed in the horizontal direction before removal of the excessive amount of the developer with a necessary amount of it retained on the subject side layer of the plate.

As described above and according to the present invention, a minimum amount of the developer is applied to and retained on the photosensitive lithographic plate and the both the upper and the lower side layers of it or the lower side layer of the same can be assuredly subjected to the development treatment.

A preferable developer according to the present invention has the surface tension of, as disclosed in Japanese Patent Application No. 61-307056, 50 enye/cm or lower at 25° C., and the viscosity of, as disclosed in Japanese Patent Application No. 63-1701, 5 cp or higher and as well 10,000 cp or lower at 25° C.

BRIEF DESCRIPTION OF THE DRAWINGS

FIG. 12 is a schematic structural view which illustrates the photosensitive lithographic plate developing apparatus according to a fifth embodiment;

FIG. 13 is a schematic structural view which illustrates the photosensitive lithographic plate developing apparatus according to a sixth embodiment; and FIG. 14 is a perspective view which illustrates a developer rubbing means according to the sixth embodiment.

DESCRIPTION OF THE PREFERRED EMBODIMENTS

Figure 1:
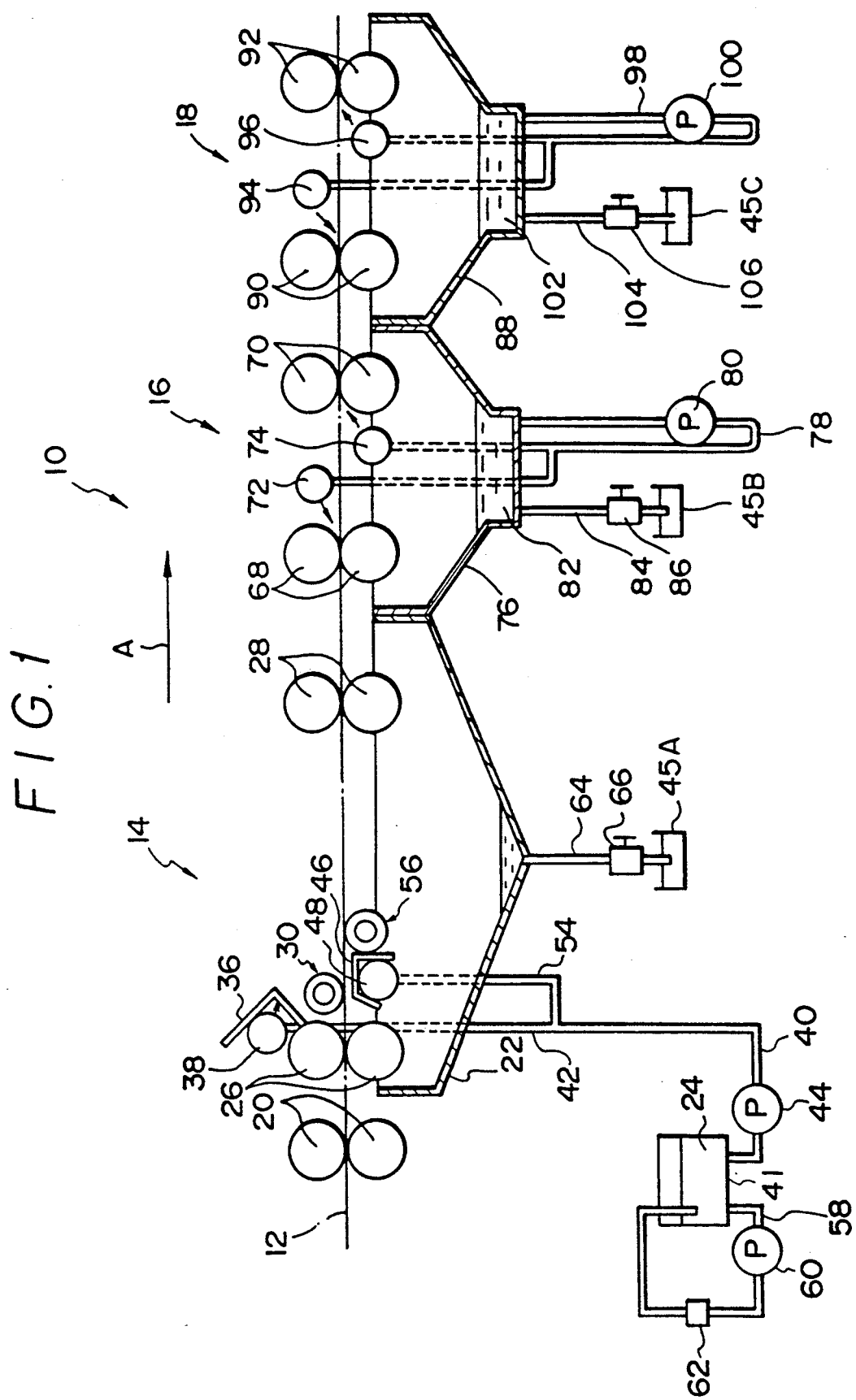
FIG. 1 is a schematic structural view which illustrates an embodiment of a photosensitive lithographic plate developing apparatus according to the present invention.

FIG. 1 is a view which illustrates an embodiment of a photosensitive lithographic plate developing apparatus 10 according to the present invention.

The photosensitive lithographic plate developing apparatus 10 comprises: a developing portion 14 for developing photosensitive lithographic plate (to be called "PS plate" hereinafter) 12, the two sides, i.e., the upper and lower surface layers of which have been each exposed with an image by an exposing device (omitted from illustration); water cleaning portion 16 for water cleaning the developed PS plate 12; and an insensitizing oil treatment portion 18 for applying insensitizing oil to the PS plate 12. The above-described portion 14, the water cleaning portion 16, and the insensitizing oil treatment portion 18 are successively disposed so that the PS plate 12 whose two sides, i.e., upper and lower surface layers, have been exposed with the images are conveyed in substantially the horizontal direction so as to be subjected to the development.

As shown in FIG. 1, a pair of conveying rollers 20 is disposed in the portion in which the PS plate 12 is inserted into the developing portion 14 so that the PS plate 12 to which the images have been exposed by the exposing device (omitted from illustration) is inserted into the space between the pair of conveying rollers 20.

An waste liquid tank 22 is provided for the developing portion 14. This waste liquid tank 22 is designed such that the upper portion thereof is opened and the central portion of the bottom portion thereof is projected downward so as to form a substantially downward projecting portion. Two conveying roller pairs 26 and 28 are respectively disposed above the waste liquid tank 22 and the direction of conveyance of the PS plate 12 (the direction designated by an arrow A). The conveying roller pairs 26 and 28 are held by a pair of side plates (omitted from illustration) such that the thus-held conveying roller pairs 26 and 28 can be respectively rotated and a driving force generated by a driving force-generating means (omitted from illustration) can be transmitted to these rollers. The PS plate 12 transmitted from the conveying roller pairs 20 is conveyed above the waste liquid tank 22 in substantially the horizontal direction by the conveying roller pairs 26 and 28 so that the PS plate 12 is introduced into the water cleaning portion 16.

A wire bar 30 is disposed between the conveying roller pair 26 and the conveying roller pair 28 and in the portion adjacent to the conveying roller pair 26. This wire bar 30 is so disposed above the conveyance passage for the PS plate 12 as to be brought into contact with the upper surface layer of the PS plate 12.

Figure 2:
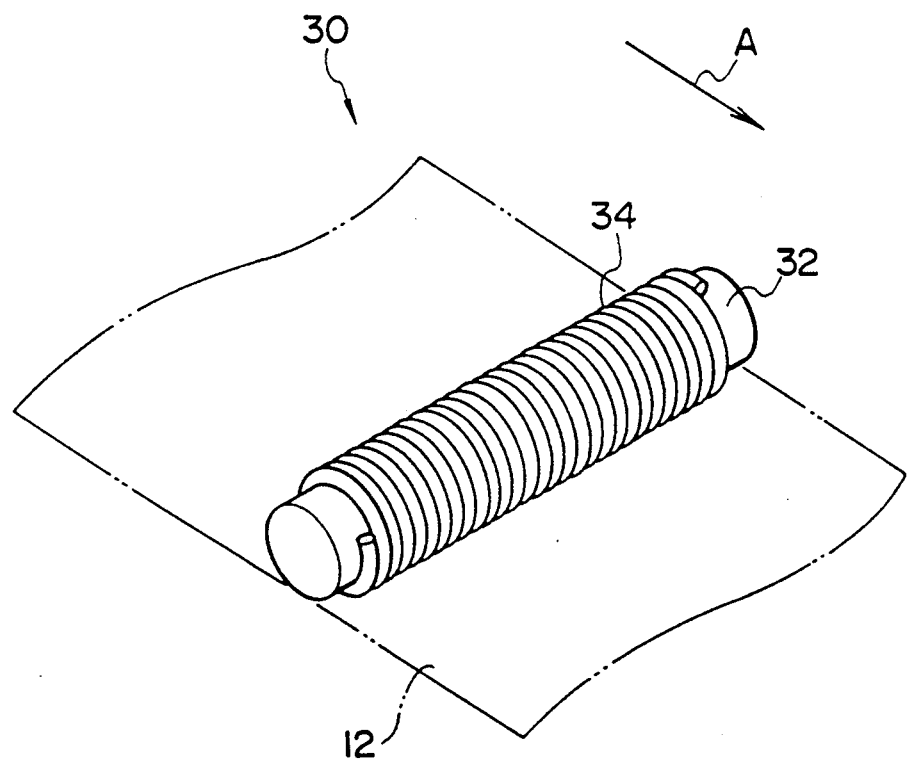
FIG. 2 is a perspective view which illustrates a wire bar.

As shown in FIG. 2, the wire bar 30 is formed such that a wire 34 is spirally wound to a shaft 32. The diameter of this wire 34 is arranged to be a predetermined diameter so that this wire 34 is brought into contact with the upper surface layer of the PS plate 12.

This wire bar 30 is also journalled by the pair of the side plates (omitted from illustration) similarly to the conveying roller pairs 26 nad 28 and is able to be rotated by a driving force by a driving means (omitted from illustration).

A developer guide plate 36 having a L-shape cross sectional shape is disposed between the upper roller of the conveying roller pair 26 and the wire bar 30 and diagonally above the upper roller of the conveying roller pair 26. This developer guide plate 36 is so disposed in parallel to the conveying roller pair 26 that the one end portion forming the L-shape thereof is able to be brought into contact with the upper roller of the conveying roller pair 26.

A spray pipe is disposed along this developer guide plate 36. A plurality of injection holes are formed in this spray pipe 38 in the axial direction of this spray pipe 38, these injection holes being faced to the corner portion of the developer guide plate 36. A pipe line 42 is inserted into this spray pipe 38, this pipe line 42 being branched from a pipe line 40. This pipe line 40 is connected to the bottom portion of a developer tank 41. A developer supply pump 44 is disposed at the intermediate portion of this pipe line 40. When this developer supply pump 44 is operated, the developer 24 is supplied to the spray pipe 38. The developer 24 supplied to the spray pipe 38 is then introduced into the portion above the upper surface layer of the PS plate 12 as a result of the guide performed by the upper roller of the conveying roller pair 26, and the thus-introduced developer 24 is measured by the wire bar 30 so as to be applied to the surface layer of the PS plate 12. A developer retaining plate 46 and a spray pipe 48 are disposed in the lower stream to the wire bar 30 in the conveying direction for the PS plate 12. The spray pipe 48 is covered by the developer retaining plate 46 and disposed below the conveying passage for the PS plate 12.

Figure 3:
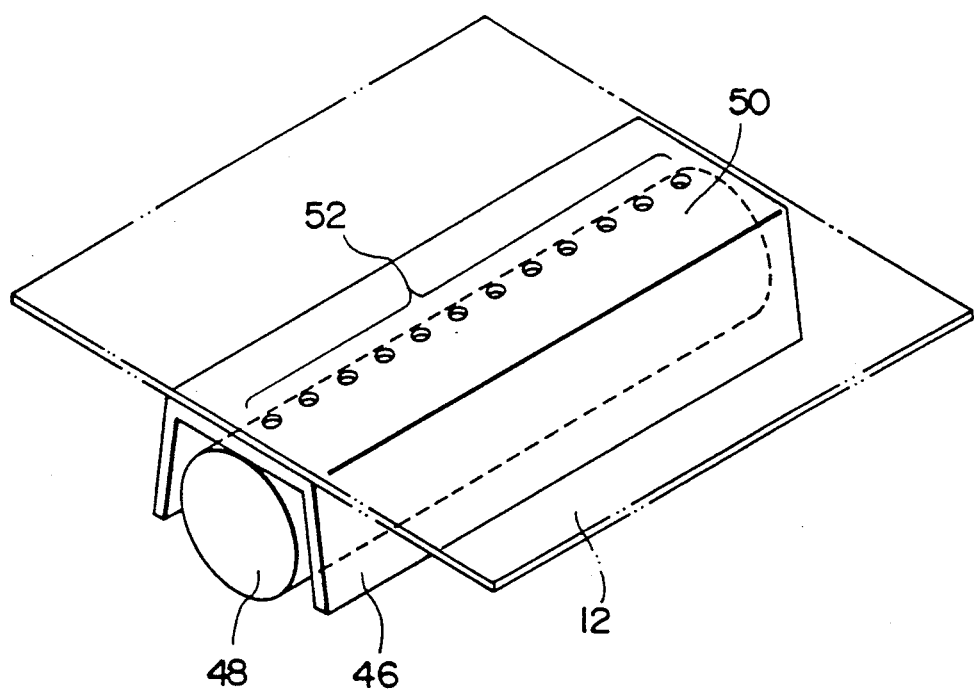
FIG. 3 is a perspective view which illustrates a spray pipe for applying a developer to the lower side of the photosensitive lithographic plate.

As shown in FIG. 3, the developer retaining plate 46 is designed to be in the form of a substantially U-shape facing downward. The intermediate portion of the developer retaining plate 46 is designed to form a flat portion 50 which confronts the conveying passage for the PS plate 12. The spray pipe 48 is disposed below this developer retaining plate 46. A plurality of injecting holes are formed in the spray pipe 48 in the axial direction of this spray pipe 48. These injecting holes are connected to the plurality of through holes 52 formed in the flat portion 50. The spray pipe 48 is connected to a pipe line 54 branched from the pipe line 40. Thus, when the developer supply pump 44 is operated, the developer 24 in the developer tank 41 is supplied to the spray pipe 48 so that it is sprayed to the lower surface layer of the PS plate 12. The developer 24 injected through the through hole 52 is retained between the lower surface layer of the PS plate 12 and the flat portion 50.

Another wire bar, designed similarly to the wire bar 30, is disposed between the conveying roller pair 28 and in the lower stream to the developer retaining plate 46 in the direction of the conveying passage for the PS plate 12.

This wire bar 56 is capable of removing the excessive amount of the developer 24 retained on the lower surface layer of the PS plate 12 so that the remaining developer is only a desired amount.

An end of the pipe line 58 is connected to the bottom portion of the developer tank 41. A circulating pump 60 and a heat exchanger 62 are disposed in the intermediate portion of this pipe line 58. Another end of the same is again connected to the developer tank 41. When the circulating pump 60 is operated, the developer 24 in the developer tank 41 is circulated and is as well heated up to a predetermined temperature.

An end of the pipe line 64 is connected to the waste liquid tank 22. A valve 66 is disposed in the intermediate portion of this pipe line 64. When this valve 66 is opened, the developer 24 in the waste liquid tank 22 is discharged into the waste liquid tank 45A.

A water cleaning tank 76 is provided for the water cleaning portion 16. Two pairs of conveying roller 68 and 70 are respectively disposed above this water cleaning tank 76 along the conveying passage for the PS plate 12. These conveying roller pairs 68 and 70 are journalled by a pair of side plates (omitted from illustration) such that the thus-journalled conveying roller pairs 68 and 70 can be rotated by a driving force generated by a driving means (omitted from illustration). When this driving means is operated, the PS plate 12 is conveyed in substantially the horizontal direction.

Spray pipes 72 and 74 are diposed between the conveying roller pair 68 and the conveying roller pair 70. The spray pipe 72 is disposed above the conveying passage for the PS plate 12 and in the portion adjacent to the conveying roller pair 68, while the spray pipe 74 is disposed below the conveying passage for the PS plate 12 and in the portion adjacent to the conveying roller 70. A plurality of injecting holes is formed in these spray pipes 72 and 74 in the axial direction of these spray pipes 72 and 74. The spray pipe 72 is opened toward the conveying roller pair 68, while the spray pipe 74 is opened toward the conveying passage for the PS plate 12.

Each end of the spray pipes 72 and 74 is connected to a pipe line 78 connected to the bottom portion of an water cleaning tank 76. A cleaning-water supply pump 80 is disposed in the intermediate portion of this pipe line 78 so that when this cleaning-water supply pump 80 is operated, cleaning water 82 accumulated in the bottom portion of the water cleaning tank 76 is supplied to the spray pipes 72 and 74.

An end of a pipe line 84 is connected to the bottom portion of the water clenaing tank 76. A valve 86 is disposed in the intermediate portion of this pipe line 84 so that when this valve 86 is opened, cleaning water 82 in the water-cleaning tank 76 is discharged into a waste liquid tank 45B.

The insensitive oil treatment portion 18 is provided with an insensitive oil treatment tank 88. Insensitive oil treatment liquid 102 is accumulated in the bottom of this insensitive oil treatment tank 88.

Two conveying roller pairs 90 and 92 are disposed above the insensitive oil treatment tank 88 in the conveying direction for the PS plate 12. These conveying roller pairs 90 and 92 are journalled by a pair of side plates (omitted from illustration) such that the thus-journalled conveying roller pairs 90 and 92 can be rotated by a driving force generated by a driving means (omitted from illustration). The PS plate 12 transmitted from the conveying roller 70 is inserted between the conveying roller pair 90 and is conveyed in substantially the horizontal direction by the conveying roller pair 92.

Spray pipes 94 and 96 are respectively disposed between the conveying roller pairs 90 and 92. The spray pipe 94 is disposed above the conveying passage for the PS plate 12 and in the portion adjacent to the conveying roller pair 90, while the spray pipe 96 is disposed below the conveying passage for the PS plate 12 and in the portion adjacent to the conveying roller pair 92.

A plurality of inject holes are formed in these spray pipes 94 and 96 in the axial direction of the spray pipes. 94 and 96. This spray pipe 94 is opened toward the conveying roller pair 90, while the spray pipe 96 is opened toward the conveying passage for the PS plate 12.

The spray pipes 94 and 96 are respectively connected to a pipe line whose one end is connected to the bottom of the insensitive oil treatment tank 88. A supply pump 100 is disposed in the intermediate portion of this pipe line 98 so that when this supply pump 100 is operated, insensitive oil treatment liquid 102 in the insensitive oil treatment tank 88 is supplied to the spray pipes 94 and 96.

An end of a pipe line 104 is connected to the bottom of the insensitive oil treatment tank 88. A valve 106 is disposed in the intermediate portion of this pipe line 104 so that when this valve 106 is opened, insensitive oil treatment liquid 102 in the insensitive oil treatment tank 88 is discharged into an waste liquid tank 45C.

Then, the operation of this embodiment will be described.

The PS plate 12 whose two sides, i.e., upper and lower surface layers) have been exposed with an image by the exposing device (omitted from illustration) is inserted between the conveying roller pair 26 of the development portion 14 after it has been inserted between the conveying roller pair 20. The PS plate 12 inserted between the conveying roller pair 26 is conveyed in substantially horizontal direction before being conveyed between the conveying roller pair 28.

The PS plate 12 transmitted from the conveying roller pair 26 is applied, on the upper surface layer thereof, with a predetermined amount of developer 24 by the wire bar 30. In this case, the developer 24 injected from the spray pipe 38 is guided by the developer guide plate 36 in the form of an L-shape so that it is dropped onto the upper roller of the conveying roller pair 26 from the lower end forming the L-shape. The developer dropped to the upper roller of the conveying roller pair 26 is supplied to the PS plate 12 which is being conveyed by the conveying roller pair 26. This developer 24 is measured by the wire bar 30 and is applied to and retained on the surface layer of the PS plate 12. Thus, the waste of developer 24 can be prevented since an excessive application of the developer 24 to the surface layer of the PS plate 24 can be prevented.

The PS plate 12 applied with a predetermined amount of the developer 24 by the wire bar 30 is further conveyed in the direction designated by an arrow A with the thus-applied developer 24 retained thereon. During this conveyance, the upper surface layer of the PS plate 12 is subjected to the development by the predetermined amount of the developer 24.

Prior to the PS plate 12 being inserted into the conveying roller pair 28, the developer supplied to the spray pipe 48 is applied to the lower side layer of the PS plate 12 through the through hole 52. The developer 24 applied to the lower surface layer of the PS plate 12 is retained on this lower side of the PS plate 12 by virtue of the flat portion 50 of the developer retaining plate 46. In this state, the excessive amount of the developer on the surface of the PS plate 12 is removed by the wire bar 56 so that the developer 24 of an amount necessary for performing the development is retained on the lower surface layer of the PS plate 12. The excessive amount of developer 24 drops and is accumulated in the bottom of the waste liquid tank 22. The PS plate is further conveyed with the necessary amount of the developer 24 applied thereto so that the lower side layer thereof is subjected to the development.

Although the excessive amount of the developer 24 removed by the wire bars 30 and 56 is, according to this embodiment, arranged to be accommodated in the waste liquid tank 22, another structure may be employed which is arranged such that a developer receiving plate is disposed below the wire bars 30 and 56 and a developer recovery tank which is connected to this developer receiving plate is provided so that the developer is recovered in one portion so as to be used again.

As described above and according to this embodiment, the developer can be applied to the two sides (layers) of the PS plate 12 by a minimum amount and these two sides can be applied with it assuredly.

The PS plate 12 whose two sdies have been applied with the developer and thus are developed is sent to the water cleaning portion 16 by the conveying roller pair 28. The PS plate 12 transmitted from the conveying roller pair 28 is inserted into the space between the conveying roller pair 68. The PS plate 12 inserted in to the space between the conveying roller pair 68 is conveyed in substantially the horizontal direction so as to be inserted into the space between the conveying roller pair 70. During this conveyance, the two sides, i.e., upper and lower surface layers, of the PS plate 12 are subjected to the water cleaning by the spray pipes 72 and 74. The PS plate 12 which has been subjected to the water cleaning is inserted into the space between the conveying roller pair 92, and is then conveyed above the insensitive oil treatment portion 18 in substantially the horizontal direction. During this conveyance, the insensitive oil treatment liquid is applied to both the side surfaces of the PS plate 12 by the spray pipes 94 and 96. The PS plate which has been subjected to the insensitive oil treatment is sent to the outside of the photosensitive lithographic plate developing apparatus 10 by the conveying roller pair 92, and is conveyed to a drying device (omitted from illustration).

Then, referring to FIGS. 4 to 7, a second embodiment of the present invention will be described.

The same components and portions as those described in the first embodiment are given the same reference numerals and the description about them are omitted here.

Figure 4:
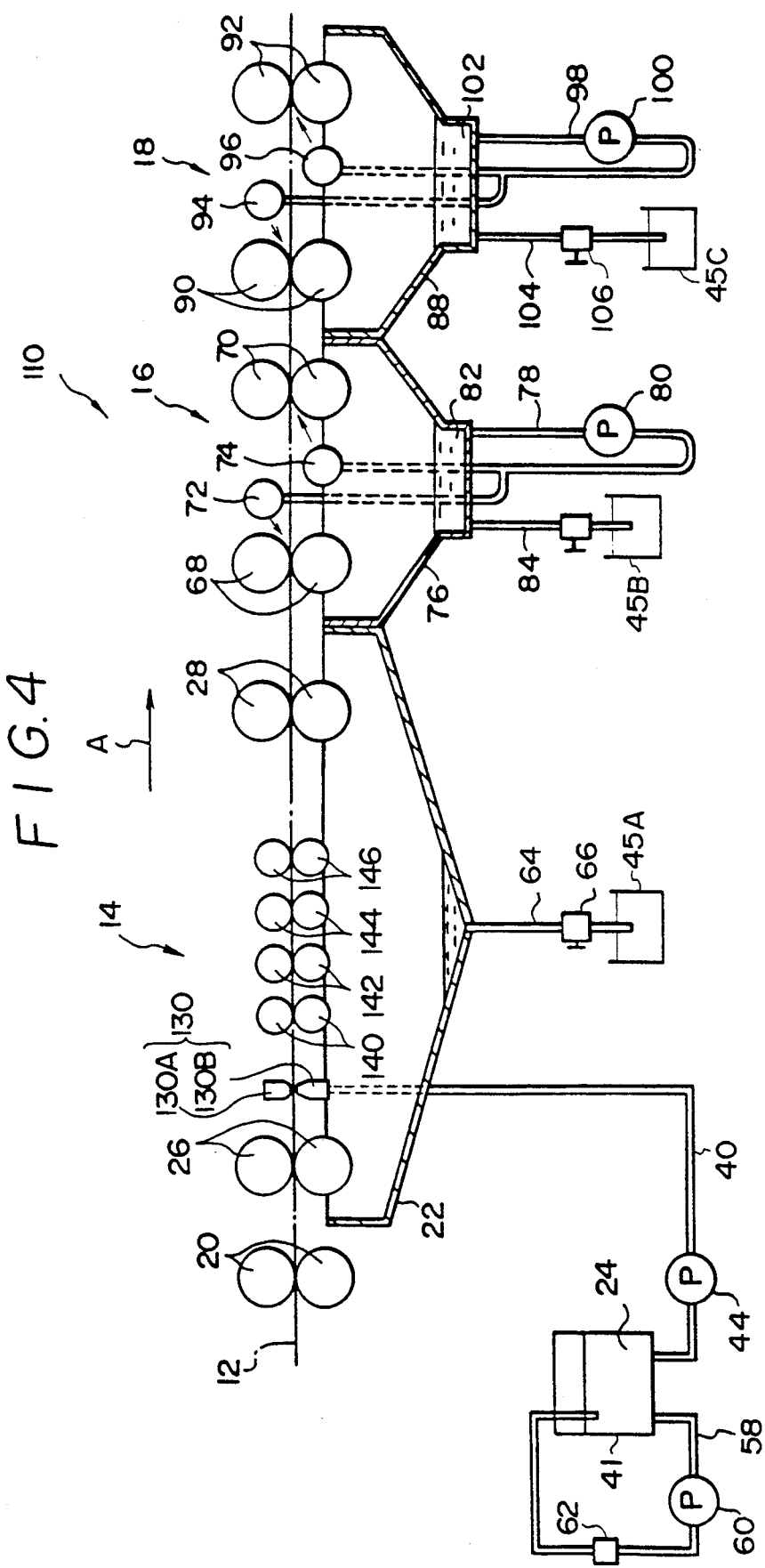
FIG. 4 is a schematic structural view which illustrates a second embodiment of the photosensitive lithographic plate developing apparatus according to the present invention.

As shown in FIG. 4, the photosensitive lithographic plate 10 according to this embodiment is arranged such that a pair of developer applying block 130 is disposed between the conveying roller pair 26 and the conveying roller pair 28 and in the portion adjacent to the conveying roller pair 26. These developer applying block 130 is respectively disposed above and below the conveying passage for the PS plate 12 so that the upper surface layer and the lower surface layer of the PS plate are applied with the developer.

Figure 5:
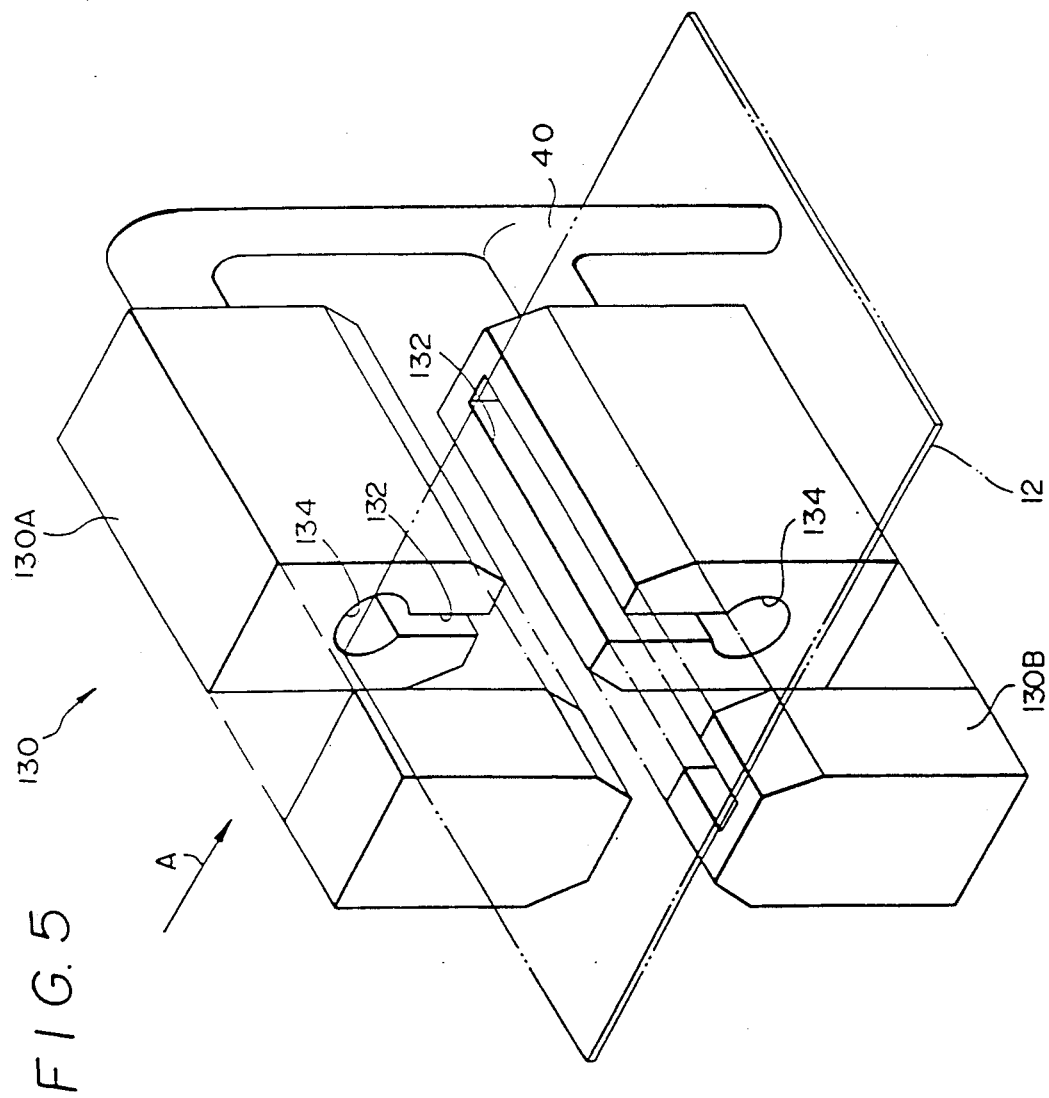
FIG. 5 is a perspective view which illustrates a developer applying block according to the second embodiment.

As shown in FIG. 5, the pair of the developer applying block 130 consists of an upper block 130A disposed above the conveying passage for the PS plate 12 and a lower block 130B disposed below it, the upper block 130A and the lower block 130B being formed in the same shape and disposed individually. Therefore, the description about the lower block 130B will be made here.

As shown in FIG. 5, the lower block 130B is formed in a rectangular parallelpiped whose overall two longer side edges are cut off so that a flat portion is formed in the central portion thereof in the widthwise direction of the PS plate 12. A slit 132 facing upward is formed in this lower block 130B. The slit 132 is arranged to be formed within the lower block 130B so as to be connected to a passage 134 formed in the longitudinal direction of the lower block 130B.

This passage 134 is connected to the pipe line 40 which passes through the bottom of the waste liquid tank 22. The supply pump 38 is disposed in the intermediate portion of this pipe line 40 so that when this supply pump 44 is operated, the developer 24 in the developer tank 41 is supplied to the lower block 130B. The developer 24 supplied to the passage 134 passes through the slit 132 so as to be discharged on to the lower surface of the PS plate 12. As a result, the lower surface layer of the PS plate 12 is applied with this developer 24. Similarly, the pipe line 40 is connected to the upper block 130A so that the developer 24 is supplied thereto and the upper surface layer of the PS plate 12 is applied with the developer 24.

Figure 7A:
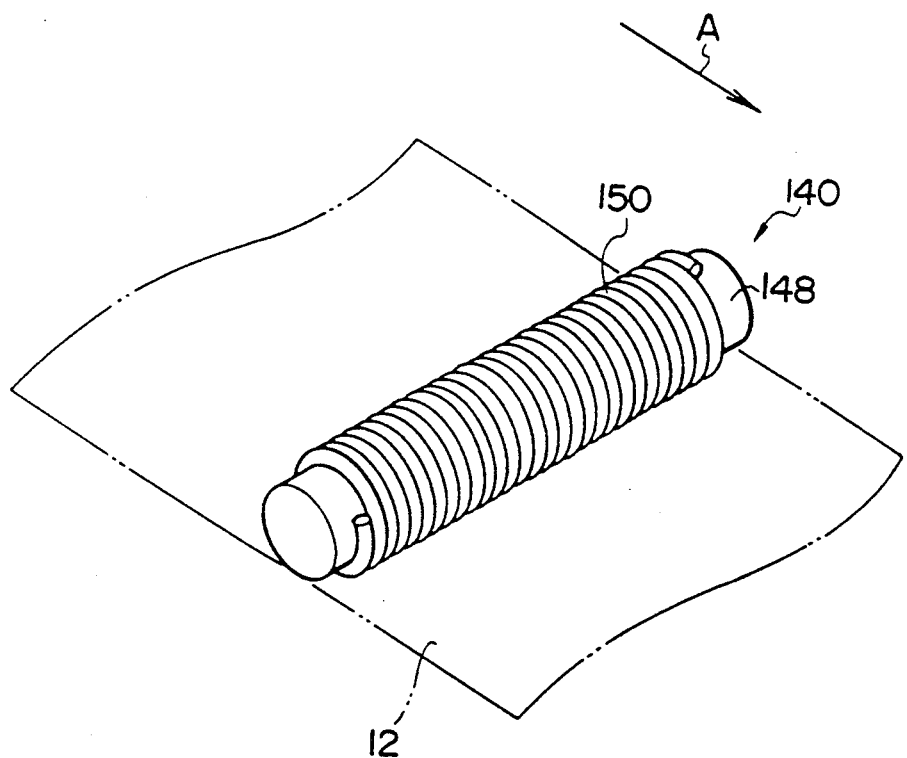
FIGS. 7A and 7B are perspective views which illustrate the wire bar.

Four pair of wire bar 140, 142, 144 and 146 are respectively disposed between the developer applying block 130 and the conveying roller pair 28. The wire bar pair 140 is, as shown in FIG. 7A, formed similarly to the wire bar 30 according to the first embodiment, in such a manner that a wire 150 is spirally wound to the shaft 148, the diameter of the wire 150 being arranged to be 0.1 to 3 mm, preferably 0.3 to 1.0 mm.

This wire bar pair 140 is, similarly to the conveying roller pairs 26 and 28, journalled by a pair of the side plates (omitted from illustration) so that the thus-journalled wire bar pair 140 is rotated by a driving force from a driving means (omitted from illustration).

Figure 7B:
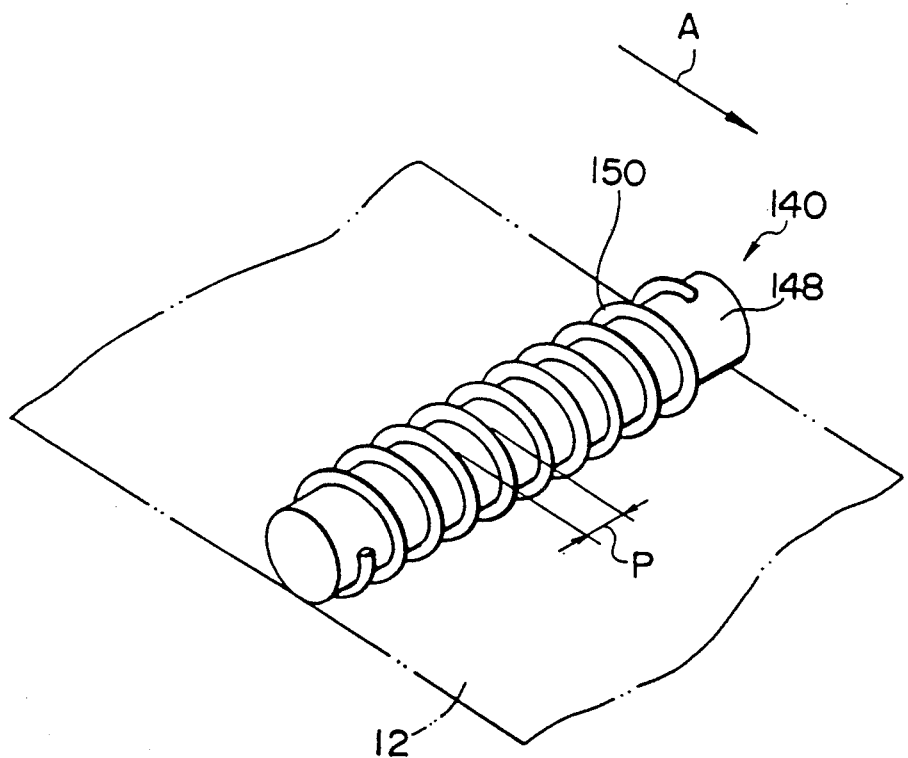

The wire bar pairs 142, 144, and 146 are each formed similarly to the wire bar pair 140, but the diameter of the wire thereof is individually arranged from the wire bar pair 140. That is, the diameter of the wire bar pairs 140 to 146 is each arranged to be gradually increased in the direction of the lower stream of the conveyance. However, it is easy to make the rotational linear speed of the wire bar the same by making the outer diameter of the wire bar the same if the diameter of the wire is arranged to be larger value. As shown in FIG. 7B, wire bars whose winding pitches P are each arranged to be individual values may be employed. That is, the pitch S of each of the wire bar pairs 140 to 146 are arranged to be a narrow pitch to a rough pitch in the lower stream for conveying the PS plate 12. These wire bars 140 to 146 act to hold and convey the PS plate and to measure and retain the developer 24 applied to the two sides, i.e., upper and lower surface layers, of the PS plate 12. The other structure is the same as that according to the first embodiment.

Then, the operation of this embodiment will be described.

The PS plate 12 whose two sides have been exposed with an image by an exposing device (omitted from illustration) is inserted into the conveying roller pair 20 and is inserted into the conveying roller pair 26. The PS plate 26 inserted into the conveying roller pair 26 is conveyed in substantially the horizontal direction so as to be conveyed toward the conveying roller pair 28.

Figure 6:
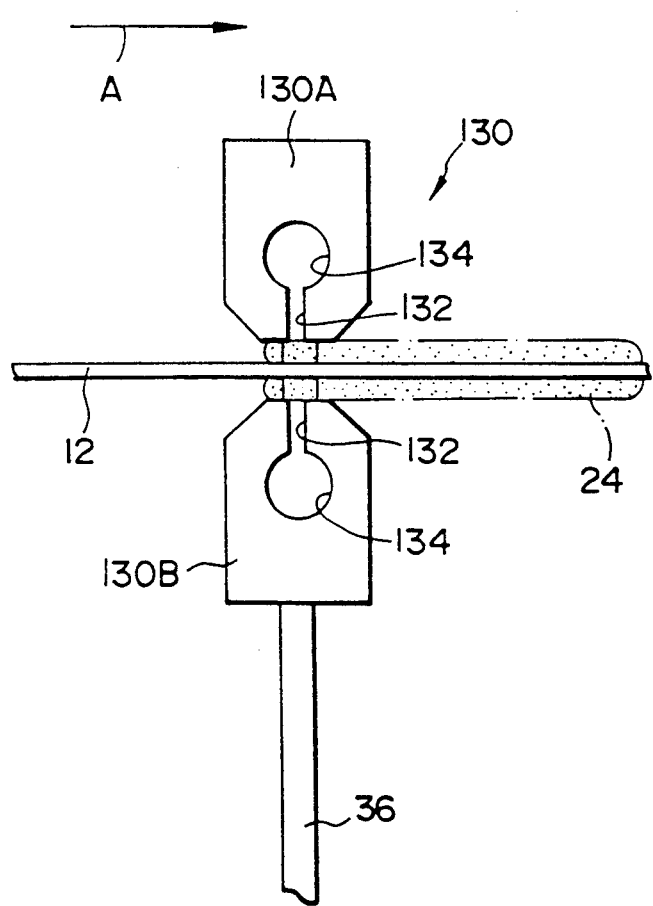
FIG. 6 is a cross-sectional view which illustrates the relationship between the developer applying block and the PS plate according to the second embodiment.

The two sides, i.e., upper and lower surface layers, of the PS plate transmitted from the conveying roller pair 26 are applied with the developer 24 by the developer applying block 130. In this case, as shown in FIG. 6, the developer 24 discharged through the slit 132 in the developer applying block 130 forms a bead between the PS plate 12 and the flat portion so that the developer 24 is applied to the surface layer of the PS plate 12 during the conveyance of the PS plate 12. As a result, the excessive application of the developer to the surface of the PS plate 12 can be prevented, and the waste of the developer can be prevented.

The PS plate whose two sides are applied with the developer by the developer applying block 130 is further conveyed in the direction designated by an arrow A, and is then held and conveyed by the wire bar pairs 140 to 146 with the developer retained thereon. As a result, the PS plate 12 is developed by the thus-retained developer.

If the developer overflows to drop from the two ends of the PS plate 12 when the PS plate 12 is held and conveyed by the wire bar pairs 140 and 146, it may be recovered for the purpose of being used again after it has been circulated since it has not been used for the development.

As described above and according to this embodiment, the minimum amount of the developer can be applied to the two sides, i.e., upper and lower surface layers, of the PS plate 12 and the two sides can be assuredly developed.

The PS plate 12 whose two sides are applied with the developer and which has been developed is then subjected to the same processings as those according to the first embodiment.

Figure 8:
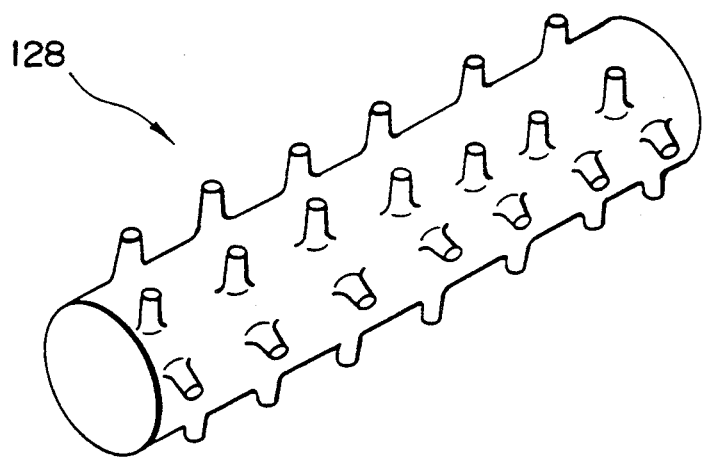
FIG. 8 is a perspective view which illustrates a roller used to replace the wire bar.

Although the wire bars 140 to 146 are employed according to this embodiment, a roller 128 having projections on the outer surface thereof as shown in FIG. 8 may be employed.

A third embodiment of the present invention will be described with reference to FIG. 9.

Figure 9:
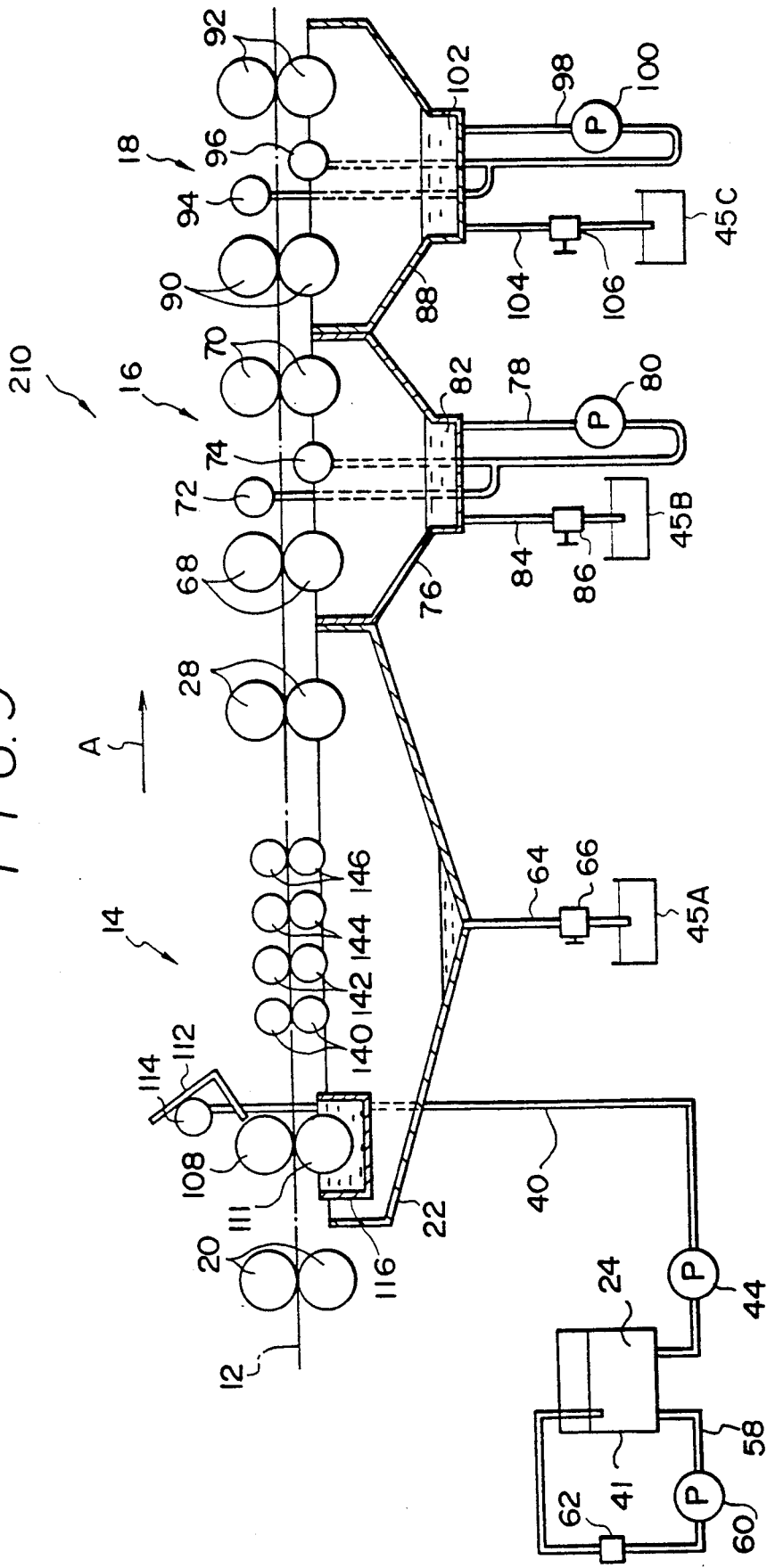
FIG. 9 is a schematic structural view which illustrates the photosensitive lithographic plate developing apparatus according to a third embodiment.

As shown in FIG. 9, in the photosensitive lithographic plate developing apparatus 210, two conveying rollers 108 and 111 are disposed above the developer tank 22 such that the conveying roller 108 is disposed in the upper portion and the conveying roller 111 is disposed in the lower portion. These conveying rollers 108 and 110 are journalled by a pair of side plates (omitted from illustration) so that the thus-journalled conveying rollers 108 and 110 are rotated by a driving force generated from a driving means (omitted from illustration). It is arranged that the PS plate 12 transmitted from the conveying roller pair 20 is inserted into these conveying rollers 108 and 111 and is conveyed in substantially the horizontal direction.

A developer guide plate having a L-shape cross sectional shape is disposed above the conveying roller 108. A spray pipe 114 is disposed between this developer guide plate 112 nad the conveying roller 108. This spray pipe 114 is connected to the pipe line 40 connected to the bottom of the waste liquid tank 22. A supply pump 44 is disposed in the intermediate portion of the pipe line 40 so that when this supply pump 44 is operated, the developer is supplied to the spray pipe 114. The developer supplied to the spray pipe 114 is guided by the developer guide plate 112 so as to be supplied to the conveying roller 108.

A half portion of the outer surface of the conveying roller 110 is dipped in the developer in a developer tank 116 disposed below the conveying roller 111. Therefore, when the conveying roller 111 is rotated, the developer in the developer tank 116 is taken out by this conveying roller 111 so as to be applied to the surface of the PS plate 12. As a result, the upper surface layer of the PS plate tranmitted from the conveying roller pair 20 is applied with the developer by the conveying roller 108, while the lower surface layer of the same is applied with the developer by the conveying roller 111 by a predetermined amount. The PS plate 12 which has been applied with the developer is, similarly to the second embodiment, held and conveyed by the wire bar pairs 140 to 146. As a result, the PS plate 12 is developed by the thus-retained developer.

As a result, the similar effect to that obtained in the second embodiment can be obtained.

A fourth embodiment will be described with reference to FIGS. 10 and 11.

Figure 10:
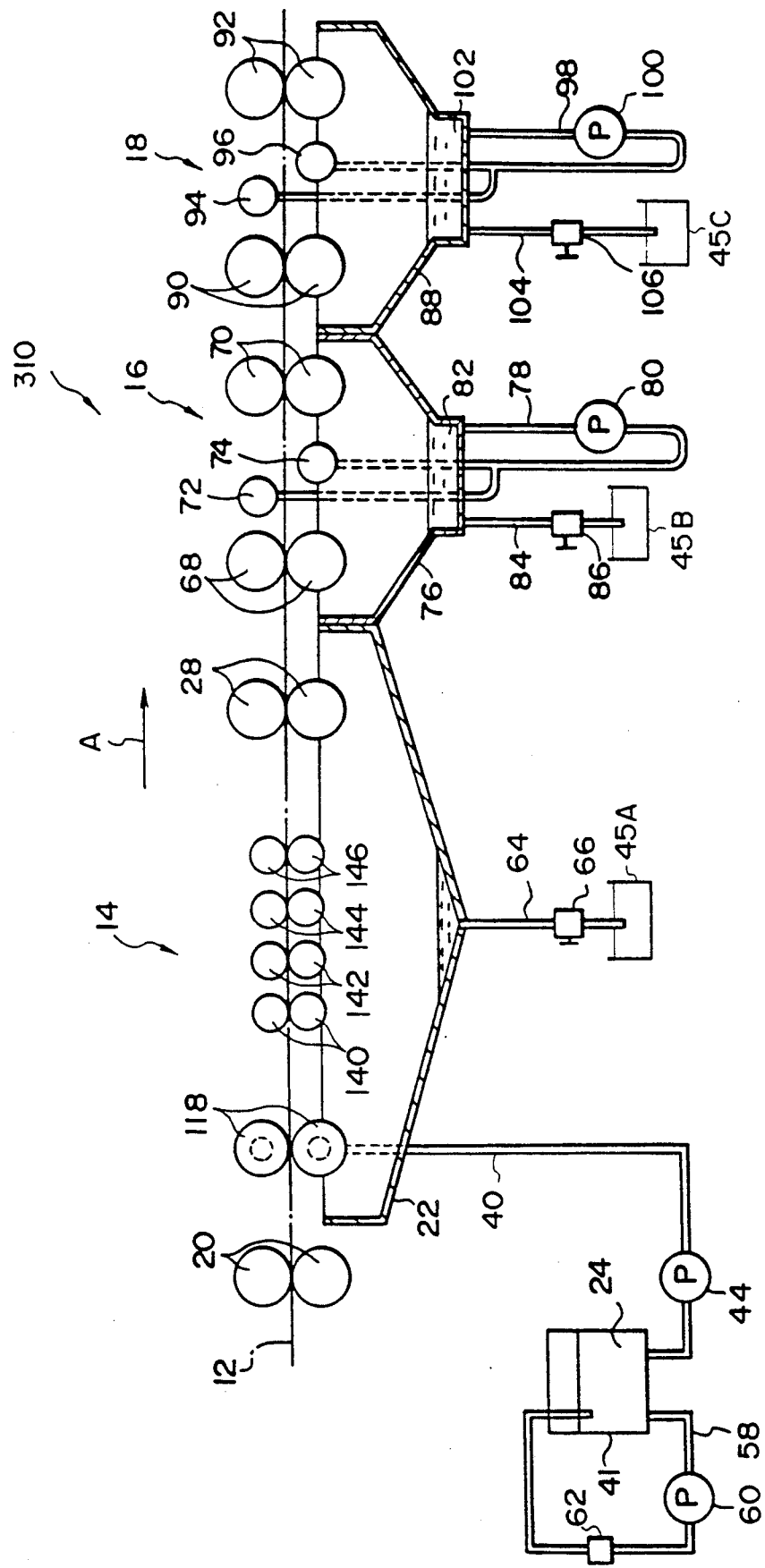
FIG. 10 is a schematic structural view which illustrates the photosensitive lithographic plate developing apparatus according to a fourth embodiment.
Figure 11:
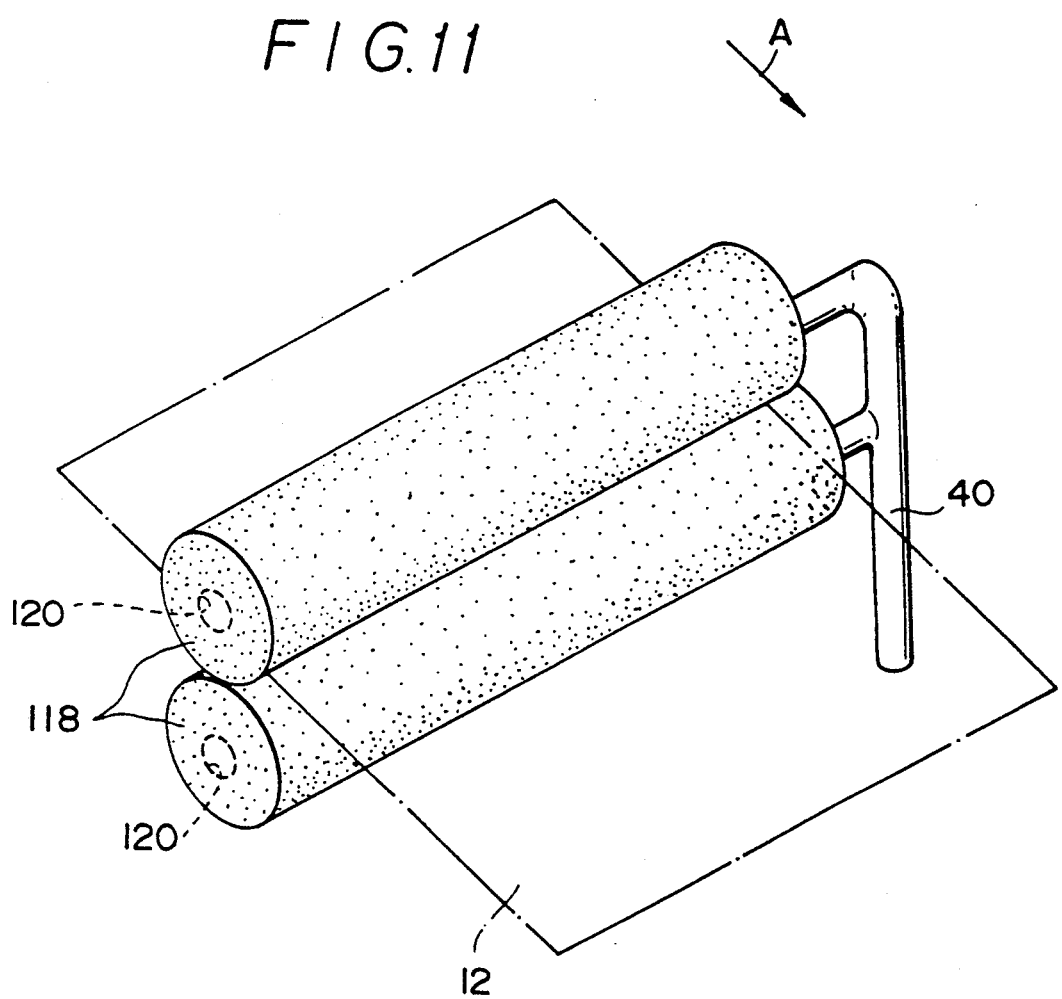
FIG. 11 is a view which illustrates a sponge roller according to the fourth embodiment.

As shown in FIG. 10, in the photosensitive lithographic plate developing apparatus 310, a conveying roller pair 118 is disposed above the developer tank 22 and in the portion adjacent to the conveying roller pair 20. These conveying roller pair 118 comprises sponge rollers formed in such a manner, as shown in FIG. 11, that a hollow portion 120 is formed in the central and axial portion thereof. An axial end of this hollow portion 120 is closed, while another end of the same is connected to the pipe line 40. As a result, when the supply pump 44 is operated, the developer is supplied into the hollow portion 120 in the conveying roller pair 118. The thus-supplied developer penetrates from the inside portion of the conveying roller 118 toward the outside so as to appear on the surface. Therefore, forming of air bubbles in the developer can be prevented.

As a result, the PS plate 12 transmitted from the conveying roller pair 20 is inserted into the conveying roller pair 118. The two sides of the PS plate 12 are applied with the developer by a predetermined amount by this conveying roller pair 118. At this time, the developer applied to the surface of the PS plate 12 is prevented from developing air bubbles since the conveying roller pair 118 is made of sponge. As a result, the developer can be uniformly applied in the widthwise direction of the PS plate 12.

The PS plate 12 whose two sides, i.e., upper and lower surface layers, are applied with the developer is, similarly to the second embodiment, developed while being conveyed and the developer thereon is controlled by the wire bar pairs 140, 142, 144, and 146.

A fifth embodiment of the present invention will be described with reference to FIG. 12.

As shown in FIG. 12, in the photosensitive lithographic plate developing apparatus 410, a pair of electrode rollers 122 are disposed in the lower stream of the conveyance of the PS plate 12 to the conveying roller pair 26. These electrode rollers are connected to a power source 124. It is arranged such that the PS plate 12 transmitted from the conveying roller pair is inserted between these electrode rollers 122. These electrode rollers 122 are journalled by a pair of side plates (omitted from illustration) so that the thus-journalled electrode rollers 122 are rotated by a driving force generated from a driving means (omitted from illustration). As a result of the conveyance of this PS plate 12, the surface of the PS plate 12 is charged positively.

Electrostatic spray guns 126 are vertically disposed with respect to the conveying passage for the PS plate 12 in the lower stream of the conveyance of the PS plate 12 to the electrode roller 122. These electrostatic spray guns 126 comprise so-called spray guns used for electrostatic coating. According to this embodiment, paint is replaced by the developer to be used by these electrostatic spray guns 126. These electrostatic spray guns 126 are connected to the pipe line 40. Therefore, when the supply pump 44 is operated, the developer is supplied to these electrostatic spray guns 126. The thus-supplied developer is negatively charged so that the same is attracted by the PS plate 12 which is charged positively. The amount of the supply of the developer is arranged to be minimum level with which the PS plate 12 can be developed.

Therefore, the PS plate 12 transmitted from the conveying roller pair 26 is charged positively by the electrode roller 122. In this state, the PS plate 12 is conveyed, and the developer charged negatively by the electrostatic spray guns 126 is sprayed to the PS plate 12. As a result, the thus-sprayed developer is attracted to the two sides, i.e., upper and lower surface layers, of the PS plate 12 so that a predetermined amount of developer is supplied to the same.

The PS plate 12 to which the developer has been supplied is further conveyed, similarly to the second embodiment, and the developer on it is retained by the wire bars 40 to 46. Thus, the PS plate 12 is developed.

A six embodiment of the present invention will be described with reference to FIGS. 13 and 14.

The components and portions which are the same as those according to the first to fifth embodiments are given the same reference numerals, and the description about them is omitted here.

Developer rubbing means 330 and 332 are disposed between the conveying roller pair 26 and the conveying roller pair 28 in the developer tank 22 of a photosensitive lithographic plate developing apparatus 510.

The rubbing means 330 is arranged such that, as shown in FIG. 14, a rubbing member 334 is disposed above the conveying passage for the PS plate 12. This rubbing member 334 is formed rectangularly in the widthwise direction of the PS plate 12. A rectangular developer-supply groove 336 is formed in the lower surface of the rubbing member 134 in the widthwise direction of the PS plate 12. A longitudinal intermediate portion of this developer supply groove 336 is connected to an end of the pipe line 42. The pipe line 42 is branched from the pipe line 40, and the pipe line 40 is connected to the bottom of the developer tank 22. The developer supply pump 44 is disposed in the intermediate portion of this pipe line 40. When this developer supply pump 44 is operated, the developer 24 in the developer tank 41 is supplied to the developer supply groove 336.

A roller 344 is connected to a longtudinal end of the rubbing member 334 with a connection bracket 342. This roller 344 is inserted into a groove 348 in a cylindrical cam 346 having a groove and journalled by side plates (omitted from illustration). This cylindrical cam 346 having a groove is connected to a drive shaft of a motor 350 supported by side plates (omitted from illustration). Therefore, when the motor 350 is rotated, the cylindrical cam 346 having a groove is rotated. As a result of this rotation, the roller 344 is moved with an aid of the groove 348 so that the rubbing member 334 is reciprocated in the widthwise direction (in the direction designated by an arrow B) of the PS plate 12. In this state, the rubbing member 334 is guided by a guide means (omitted from illustration). The pipe line 338 is made of a flexible material so that the same can follow this movement.

As a result of this reciprocating motion, the developer supplied from the developer supply groove 336 to the PS plate 12 can be distributed widely.

A receiving roller 351 is dispoed below the conveying passage for the PS plate 12 at positions corresponding to the rubbing member 334. As a result, the PS plate 12 can be held between the rubbing member 334 and the receiving roller 351.

In the lower stream to the developer rubbing means 330 in the direction of conveyance of the PS plate 12, another developer rubbing means 332 is disposed, this developer rubbing means 332 being arranged to be the same structure as that of the developer rubbing means 330. This developer rubbing means 332 is arranged such that the rubbing member 334 thereof is disposed to correspond to the lower surface layer of the PS plate 12. The receiving roller 351 having the same structure is disposed to correspond to the upper surface layer of the PS plate 12. The rubbing member 334 according to this embodiment as well serves as a means for retaining the developer to be supplied. The pipe line 54 and the developer supply groove 336 are connected to each other. As a result, the developer supplied to the developer supply groove 336 is applied to the lower surface layer of the PS plate 12, and is distributed widely on the lower surface layer of the PS plate 12 by the rubbing member 334.

The other structure is the same as that of the first to fifth embodiment. Therefore, the description about them is omitted here.

Then, the operation of this embodiment will be described.

The PS plate 12 whose two sides, i.e., upper and lower surface layers, have been exposed with an image by an exposing device (omitted from illustration) is inserted into the conveying roller pair 20, and is inserted into the conveying roller pair 26 in the development portion 14. The PS plate 12 inserted into the conveying roller pair 26 is conveyed in substantially the horizontal direction so as to be sent to the conveying roller pair 28.

The PS plate 12 sent form the conveying roller pair 26 is supplied with, on the upper surface layer thereof, the developer from the developer supply groove 36 in the rubbing member 334. The thus-supplied developer is distributed widely on the upper surface of the PS plate 12 by the rubbing member 334. As a result, the upper surface layer of the PS plate 12 is assuredly applied with the developer so that the development is promoted. At this time, the lower surface layer of the PS plate 12 is supported by the receiving roller 351 disposed below the PS plate 12.

The PS plate 12 whose upper surface layer has been applied with the developer by the developer rubbing means 330 and the development of which has been promoted is further conveyed so as to be held by the rubbing member 334 and the receiving roller 351 of the developer rubbing means 332. As a result, the lower surface layer of the PS plate 12 is supplied with the developer, and the thus-supplied developer is distributed widely by the rubbing member 334. As a result, the developing of the lower surface layer of the PS plate 12 is promoted and this development is assuredly conducted.

As described above and according to this embodiment, since a predetermined amount of developer is supplied to the two side layers of the pS plate 12 and then the thus-supplied developer is distributed widely on the surface so as to conduct the development, both the two side layers of the PS plate 12 can be assuredly developed with minimum amount of the developer.

The PS plate 12 whose two side layers have been applied with the developer and which is thereby developed is conveyed by the conveying roller pair 28 to the water cleaning portion 16. The ensuing processings are conducted similarly to those according to the first to fifth embodiments.

What is claimed is:

1. A method of developing photosensitive lithographic plate by applying developer to a photosensitive lithographic plate with at least one layer which has been exposed with an image, comprising the steps of:
   (a) conveying the photosensitive lithographic plate with one layer facing substantially downward;
   (b) applying a predetermined amount of substantially unused developer to at least said one layer of the photosensitive lithographic plate which is being conveyed; and
   (c) retaining the developer on said one layer by bringing a point-contact roller into point contact with said one layer.

2. A method of developing photosensitive lithographic plate according to claim 1, further comprising a step (d) after said step (c), the step (d) being arranged so as to remove said developer from the one layer, said developer being retained on said one layer to remain by the predetermined amount which is the minimum amount required for development of the photosensitive lithographic plate.

3. A method of developing photosensitive lithographic plate according to claim 2, wherein said step (b) is arranged in such a manner that said developer is applied at predetermined space in the widthwise direction of said photosensitive lithographic plate.

4. A method of developing photosensitive lithographic plate by applying developer to a photosensitive lithographic plate with at least one layer which has been exposed with an image, comprising the steps of:
   (a) conveying the photosensitive lithographic plate with one layer facing substantially downward;
   (b) applying a predetermined amount of substantially unused developer to at least said one layer of the photosensitive lithographic plate which is being conveyed; and
   (c) retaining the developer on said one layer by positioning a substantially flat retaining plate adjacent said one layer such that said developer is retained on said one layer by being retained on a flat surface of said retaining plate.

5. A method of developing photosensitive lithographic plate according to claim 1, wherein said steps (b) and (c) are arranged in such a manner that said developer is applied and is retained on said one layer.

6. A method of developing photosensitive lithographic plate by applying developer to a photosensitive lithographic plate with at least one layer which has ben exposed with an image, comprising the steps of:
   (a) conveying the photosensitive lithographic plate with one layer facing substantially downward;
   (b) applying a predetermined amount of substantially unused developer to at least said one layer of the photosensitive lithographic plate which is being conveyed; and
   (c) retaining the developer on said one layer, wherein said step (c) is arranged in such a manner that said developer is retained and spread on said one layer.

7. A method of developing photosensitive lithographic plate according to claim 6, wherein said spread in said step (c) is conducted by having said one layer rubbed by a rubbing member.

8. An apparatus for developing photosensitive lithographic plate capable of developing, by a developer, a photosensitive lithographic plate with at least one layer which has been exposed with an image while the photosensitive lithographic plate is being conveyed with said one layer facing substantially downwards, comprising:
   supply means for supplying a predetermined amount of substantially unused developer to said one layer; and
   retaining means for retaining the developer on said one layer, wherein said retaining means is provided with a flat portion retaining the developer on the upper surface thereof.

9. An apparatus for developing photosensitive lithographic plate according to claim 8, further comprising removing means for removing the developer from said one layer, said developer being retained on said one layer so as to remain by said predetermined amount which is the minimum amount required for development of the photosensitive lithographic plate.

10. An apparatus for developing photosensitive lithographic plate according to claim 9, wherein said removing means is provided with a wire bar formed by spirally winding a wire to a shaft, said wire being capable of being brought into contact with said one layer.

11. An apparatus for developing photosensitive lithographic plate according to claim 8, wherein said supply means is provided with a plurality of supply ports supplying the developer to said photosensitive lithographic plate at predetermined spaces along the widthwise direction of said photosensitive lithographic plate.

12. An apparatus for developing photosensitive lithographic plate according to claim 8, wherein said supply means comprises a rotational roller, a portion of which is dipped in said developer, capable of taking up said developer by rotational thereof so as to apply the same to said one layer.

13. An apparatus for developing photosensitive lithographic plate according to claim 8, said supply means comprises a charging means for charging said photosensitive lithographic plate and an electrostatic spray gun for spraying said developer to said one layer of said photosensitive lithographic plate which has been charged.

14. An apparatus for developing photosensitive lithographic plate capable of developing, by a developer, a photosensitive lithographic plate with at least one layer which has been exposed with an image while the photosensitive lithographic plate is being conveyed with said one layer facing substantially downwards, comprising:
- supply means for supplying a predetermined amount of substantially unused developer to said one layer; and
- retaining means for retaining the developer on said one layer, wherein said retaining means comprises a linear-contact roller capable of being brought into linear contact with said one layer.

15. An apparatus for developing photosensitive lithographic plate according to claim 4, wherein said supply means and said retaining means are integrally formed.

16. A method of developing photosensitive lithographic plate according to claim 6, wherein said point-contact roller is constructed of a roller having projections on the outer surface thereof, said roller retaining the developer in the spaces formed by said projections and said one layer, and said roller also functioning as removing means for removing excessive developer from said one layer by said projections.

17. An apparatus for developing photosensitive lithographic plate according to claim 14, wherein said point contact-roller includes a roller having projections on the outer surface thereof, said roller retaining the developer in the spaces formed by said projections and said one layer, and said roller functioning as removing means for removing excessive developer from said one layer by said projections.

* * * * *